(12) United States Patent
Fliess et al.

(10) Patent No.: US 9,339,839 B2
(45) Date of Patent: May 17, 2016

(54) DOSING SYSTEM AND DOSING METHOD (75) Inventors: Mario Fliess, Munich (DE); Juergen Staedtler, Feldkirchen-Westerham (DE)

(73) Assignee: VERMES MICRODISPENSING GMBH, Otterfing (DE)

( * ) Notice: Subject to any disclaimer, the term of this patent is extended or adjusted under 35 U.S.C. 154(b) by 53 days.

(21) Appl. No.: 14/236,014

(22) PCT Filed: Jul. 5, 2012

(86) PCT No.: PCT/EP2012/063078
§ 371 (c)(1),
(2), (4) Date: Jun. 12, 2014

(87) PCT Pub. No.: WO2013/017368
PCT Pub. Date: Feb. 7, 2013

(65) Prior Publication Data
US 2014/0291358 A1    Oct. 2, 2014

(30) Foreign Application Priority Data
Jul. 29, 2011   (DE) .......................... 10 2011 108 799

(51) Int. Cl.
*B67D 3/00* (2006.01)
*B05C 11/10* (2006.01)
(Continued)

(52) U.S. Cl.
CPC .......... *B05C 11/1028* (2013.01); *B05C 5/0225* (2013.01); *G01F 11/021* (2013.01);
(Continued)

(58) Field of Classification Search
CPC ............ B05B 11/3001; B05B 11/3005; B05B 11/3007; B05B 11/3016; B05B 11/3008; B05C 11/1028; B05C 11/1034; B05C 17/00543; B05C 5/00; B05C 5/0212; B05C 5/0225; H05K 2203/0126; G01F 11/021; G01F 11/32
USPC .......... 222/1, 181.1, 262, 309, 340, 380, 387, 222/389, 420, 504, 509, 559; 604/141
See application file for complete search history.

(56) References Cited

U.S. PATENT DOCUMENTS 5,022,556 A    6/1991  Dency et al.
5,152,678 A *  10/1992 Zeck .............................. 417/401
(Continued)

FOREIGN PATENT DOCUMENTS

CN    201552079 U    8/2010
DE     2717539 A1    10/1978
(Continued)

OTHER PUBLICATIONS

International Search Report; PCT/EP2012/063078.
(Continued)

*Primary Examiner* — Frederick C Nicolas
*Assistant Examiner* — Bob Zadeh
(74) *Attorney, Agent, or Firm* — Studebaker & Brackett PC (57) ABSTRACT

A dosing system for a liquid or viscous dosing material, including an actuator system, that has at least one actuating element and a nozzle with an outlet opening. The dosing system is designed so that during a movement in a closure direction the actuating element is initially moved in a first partial movement in such a way that the actuating element is separated from the closure element at a stop location, intended for that purpose, and then comes into contact with the closure element at the stop location and exerts an impulse on the closure element. This also relates to a corresponding dosing method.

11 Claims, 10 Drawing Sheets

(51) Int. Cl.
*B05C 5/02* (2006.01)
*G01F 11/02* (2006.01)
*H05K 3/12* (2006.01)

(52) U.S. Cl.
CPC ........... *B05C5/0212* (2013.01); *B05C 11/1034* (2013.01); *H05K 3/1241* (2013.01); *H05K 2203/0126* (2013.01)

(56) References Cited

U.S. PATENT DOCUMENTS

| | | | | |
|---|---|---|---|---|
| 5,320,250 | A | * | 6/1994 | La et al. ............... 222/1 |
| 5,467,899 | A | * | 11/1995 | Miller ............... 222/309 |
| 6,595,436 | B2 | * | 7/2003 | Kirzhner ............ F02M 51/0603 239/102.2 |
| 7,694,855 | B2 | * | 4/2010 | Chastine et al. ........... 222/146.5 |
| 8,322,575 | B2 | | 12/2012 | Riney |
| 8,448,818 | B2 | | 5/2013 | Ikushima |
| 8,807,400 | B2 | | 8/2014 | Ikushima |
| 2005/0230438 | A1 | * | 10/2005 | Saidman ............... 222/504 |
| 2008/0061080 | A1 | | 3/2008 | Riney |
| 2010/0294810 | A1 | * | 11/2010 | Ikushima ............... 222/420 |
| 2012/0061426 | A1 | * | 3/2012 | Hogan et al. ............... 222/504 |
| 2013/0233891 | A1 | | 9/2013 | Ikushima |

FOREIGN PATENT DOCUMENTS

| | | |
|---|---|---|
| DE | 3108793 A1 | 9/1982 |
| DE | 3108793 C2 | 1/1985 |
| EP | 1588777 A2 | 10/2005 |
| EP | 1652588 A1 | 5/2006 |
| JP | H03-170817 A | 7/1991 |
| WO | 2008/126373 A1 | 10/2008 |

OTHER PUBLICATIONS

An Office Action; "Notice of Reasons for Rejection," issued by the Japanese Patent Office on Dec. 8, 2015, which corresponds to Japanese Patent Application No. 2014-522018 and is related to U.S. Appl. No. 14/236,014; with English language partial translation.

The First Office Action issued by the State Intellectual Property Office of the People's Republic of China on Oct. 8, 2015, which corresponds to Chinese Patent Application No. 201280038083.2 and is related to U.S. Appl. No. 14/236,014; with English language translation.

* cited by examiner

DOSING SYSTEM AND DOSING METHOD

FIELD OF THE INVENTION

The present invention relates to a dosing system for a liquid or viscous dosing material. It also relates to a method of dosing a liquid or viscous dosing material.

BACKGROUND OF THE INVENTION

The dispensing (more particularly of an as precisely determined amount as possible), i.e. the dosing, of liquid or viscous dosing materials, for example, adhesives, paints, printing varnishes, conductive substances bound in a binder system such as soldering pastes, converter materials for LEDs etc. is intended for the targeted application of such dosing materials, for example on target surfaces. For instance, electronic circuit boards are specifically and precisely provided with conductive substances, replacing previously necessary time-consuming and costly processes, such as scraping processes, based on masking. A particular challenge consists in the high-precision delivery of the dosing materials to the target surface, i.e. at the right time, at the right place and in a precisely dosed quantity. This can be done, for example, in that drop-wise dispensing via the nozzle of a dosing system takes place, whereby the size and/or quantity of the drops is predetermined as precisely as possible through the effect of the nozzle. Alternatively the dosing material can be sprayed on in a jet or applied as a mist.

The challenge of high-precision dosing becomes even greater if the dosing material is not an easily flowing substance, with a similar consistency to that of water, but a relatively viscous medium. Examples of these are highly enriched adhesives, strongly pigment-enriched paints or varnishes with a high proportion of pigment etc. Particularly in the case of such material and/or in situations where dosing materials are to be applied, the dosing of which must be particularly finely adjusted, it is decisive that the nozzle closes at exactly the required moment. This results in a specific drop break-off of the drops ejected by the nozzle, thereby allowing as precise dosing as possible by way of as small drops as possible.

In DE 27 17 539 A1 devices for the dosing of liquid single component adhesives are described. In these devices needle valves actuated by compressed air are used.

An adhesive application device is also described in DE 31 08 793 C2 in which the adhesive drips downwards out of a nozzle opening, whereby to assist this via an annular gap outside the nozzle compressed air is emitted which carries along the adhesive. The nozzle opening can be closed by means of a nozzle needle that is attached to a piston and through this can be moved in position.

U.S. Pat. No. 7,694,855 B2 describes a dosing system with a pneumatic actuator system, which via a lever acts on a plunger that opens and closes an outlet opening of a nozzle.

In high-precision fine applications, especially in the field of micro-dosing and particularly in the field of the above dosing materials, such systems reach their technical limits, more particularly because of the too slow mechanics.

SUMMARY OF THE INVENTION

The aim of the present invention is therefore to provide a possibility for optimising the dosing of dosing materials by means of a dosing system with a nozzle. Particular attention is paid to the fact that the dosing system and the nozzle can work more effectively and/or precisely than was previously the case. Preferably the production of smaller drop sizes than before is made possible.

Accordingly a dosing system of the type cited in the introductory section comprises an actuator system, that has at least one actuating element, and a nozzle with an outlet opening, whereby during a movement in a closure direction, the actuating element is moved in a first partial movement in such a way that it is separated from the closure element by a stop location intended for such a purpose, and then comes into contact with the closure element at the stop location and exerts an impulse on the closure element.

For this the actuator system is preferably arranged in an actuator area, specially provided for this, which is, if possible, spatially separated from the nozzle area. As actuator system is defined as a system that comprises at least one (preferably automatic) actuator. The actuating element itself can be the actuator if it acts on the closure element directly at the stop location, or the actuating element comprises a mechanical force-transmission element that is directly or indirectly coupled to an actuator and therefore transmits forces and/or movements of the actuator onto the closure element. Thus, for example, the actuating element can have a catch and/or a lever. In other words the actuating element operates the closure element directly via a temporary contact on the stop location.

Designated as the stop location is the specially provided contact area between the actuating element and the closure element, which is intended for the purpose of specific force and/or movement transmission, i.e. for impulse transmission, between the actuating element and the closure element. A single point of contact, as well as a linear or flat contact can therefore also serve as a stop location.

Defined as a closure element is a one-piece or multiple-piece mechanical element, that is preferably elongated in shape, for example cylindrical, thus for instance a plunger using silicon for example. It can however also be a round or oval closure element that closes a closure channel and/or the outlet opening in a (closing) position. A closure channel in this connection is a hollow body, preferably a cylindrical hollow body which on its inside defines, i.e. encloses, a hollow space, within which the closure element is arranged, at least partially, so that the closure element closes the hollow space.

The closure element can, for example, operated by the actuator system, be moved in an opening and/or a closure direction. A to and fro movement of the closure element is thus produced, for which it is movably arranged and borne in these two directions of movement.

In accordance with the invention such a system is now designed in such a way that the movement of the actuating element can be divided into at least two partial movements: in a first partial movement the actuating element is moved, preferably in a contact-free manner, independently of the closure element. During this first partial movement the actuating element is (still) separated at a stop location, intended for this purpose, from the closure element. The actuating element is then (at the end of this first partial movement) brought into contact with the closure element at the stop location and thereby transmits an impulse. The actuating element and the closure element then jointly complete a second partial movement in the closure direction, whereby during this second partial movement they do not necessarily have to be in contact at the stop location. There can therefore simply be an impulse transmission to the closure element that results in the closure element moving more quickly in the closure direction than the actuating element. However, during the second partial movement both elements can also move jointly in contact with each other over a certain period of time, preferably as far as the end position of the closure element, in which the closure element fully closes the nozzle of the dosing system. This end position is reached, in particular, when the closure element is positioned on an outlet opening of the nozzle so that the latter is closed by the closure element.

Such temporary coupling and de-coupling, i.e. the connection and separation of the actuating element and closure element means that the actuator system, more particularly the actuating element, at the time of de-coupling from the closure element can build up an advance velocity, i.e. is already accelerated, before it comes into contact with the closure element at the stop location. This advance velocity can then specifically be used to build up an impulse which is then transmitted to the closure element. This finally results in a higher final speed of the closure element in the closure direction than if the actuating element and the closure element were to travel the same path in contact at the stop location, which the closure element travels here after the impulse transmission. This has the effect that the closure element exerts its closing effects more quickly and effectively, thereby achieving the desired precise and rapid drop break-off. In this way smaller drop sizes are also made possible.

Whereas in the prior art constant coupling of the actuating element of the actuator system with the closure element in the closure direction is envisaged, the present invention specifically turns away from this permanently connected system and replaces it with an only temporary connection and mechanical decoupling of the actuating and closure element. The two elements can therefore travel independent paths at times, which when they come together at the right time mean that the velocity of the closure element in the closure direction is greater, though the path of the closure element in the direction of its end position, i.e. the closing position is much shorter.

A method of the type set out in the introduction can be further developed in that it is implemented with the aid of a dosing system that comprises an actuator system having at least one actuating element, and a nozzle with an outlet opening. The actuating element is initially moved in a closure direction in a first partial movement in such a way that it is separated from the closure element at a stop location and then comes into contact with the closure element at the stop location and transmits an impulse to the closure element.

Further advantageous embodiments and further developments of the invention are set out as well as the following description. The method can also be further developed for the dosing system and further developed in accordance with the following description.

Within the context of the invention it is preferred to design, arrange and limit the actuator system and the closure element so that in operation the actuating element and the closure element travel a different maximum path. The actuating element and the closure element therefore have a different, limited, travel path. Here, it is particularly preferably that a maximum path of the closure element is smaller than a maximum path of the actuating element. In general it can be said that the greater the difference between the travel path of the actuating element and that of the closure element, the greater the impulse transmitted when the actuating element comes into contact with the closure element during the closing movement in the closure direction. The greater the impulse during this impact the more quickly the closure element is moved in the direction of its intended end position.

On its path to reach the closure element at the stop location, the actuating element builds up a kinetic energy, which acts on the closure element on impact. This produces an impulse and ultimately much greater acceleration of the closure element, than if the actuating element had travelled the entire path jointly with the closure element of the actuating element.

In tests it has been shown that the travel path, i.e. the maximum path, of the actuating element, is at least 1.1 times, particularly preferably at least twice as large as the travel path of the closure element.

In operation the closing speed of the closure element is preferably more than 0.5 m/s.

In one test set-up the closure element had a mass of 1 g (including spring) and the actuating element a mass of 3.5 g (typical values ranged from 3.5 to 10 g), and a driving force (assumed to be constant) of 250 N acted on the actuating element. The total path of the actuating element was 0.3 mm, the total path of the closure element in a first scenario was 0.09 mm and in a second scenario 0.15 mm, i.e. half of the total path.

This results in the following values:

In the first scenario the actuating element developed a speed of 5.5 m/s, in the second scenario 4.6 m/s. In the first scenario the closure element was accelerated to a speed of 7.7 m/s (on reaching the outlet opening), in the second scenario to 6.4 m/s. These values take into account the effect losses during impulse transmission, otherwise they would have been 20% higher. If the two had travelled the same path of the closure element, in the first scenario a joint speed of 3.1 m/s and in the second scenario 4 m/s would have resulted. The reduced travel path of the closure element (and thus its low ability build up speed over the short distance), is therefore balanced out by the impulse transmission by the actuating element so that a sudden, very fast impact is produced. In summary it can be stated that with a travel path of the actuating element double that of the closure element a very good increase speed of the closure element can be achieved.

A different travel path of the actuating element and of the closure element can be realized, for example, in that the closure element is limited by a stop device in its maximum path along an axis of the closure direction. Such a stop device can, for instance, be a firmly installed stop surface within the housing of the dosing system or generally a firmly installed stop location. It can however, and this is preferred, be a stop device the position of which can be changed, for example a stop screw which be screwed into the housing the direction of the closure element or screwed out away from the closure element.

A further development of such an adjustable stop device consists, for example, in that it is an automatic, preferably motorized, adjustable stop device. A motorized stop device can for example be adjusted by a servomotor. Other automatic stop devices include mechanically, for example, hydraulically or pneumatically operated adjustable stop devices, preferably operated from outside the dosing system.

In the case of an automatically adjustable stop device, by way of appropriate measuring devices, a position of the stop device or a force relationship within the dosing system, particularly with regard to the forces of the closure element on the stop device, can be determined. The generated data, whether position data or measuring data representing occurring forces, can be used as the basis for adjusting the position of the stop device. Advantageously this can take place within a closed control loop, so that in the event of too high forces of the closure element on the stop device, adjustment can take place so that the stop device is positioned further away from the closure element.

In accordance with a first variant the actuator system comprises a hydraulically and/or pneumatically operated actuator. Such an actuator can for example be designed as a cylinder-piston system, in which via one or two inlets a high pressure or low pressure can be set. However, other mechanical actuator systems, based on other mechanical actuators are also possible, for example operated by gears etc.

A second variant that can be selected additionally or alternative to the first variant consists in the actuator system being electrically or electronically operated. Here it is particularly preferable that the actuator system has a piezoelectric actuator. Electrical, but particularly electronic actuators and very particularly piezoelectric actuators are very fast and effective in terms of effect and can thus be particularly effectively used in micro-dosing system and in case of the ultrafine dosage resolutions required here.

As has been mentioned, the actuating element can simply be an actuator that temporarily acts directly on the closure element. In addition to an actuator, a further force transmission element, for example a catch, can be provided. Particularly preferably the actuating element has a lever which temporarily connects the actuator with the closure element. In addition to the force transmission from the actuator to the closure element, a lever of this type has the additional advantage that it can produce a transfer effect so that, for example, a smaller travel path of the actuator is sufficient in order, through appropriate transfer via the lever, to bring about a larger travel path in the area of the closure element, i.e. along the effect axis of the closure element.

In general it is preferred that a maximum operating path of an actuator of the actuator system differs from the maximum path of the closure element, and particularly preferably is larger than that of the closure element. This means that even if the actuator does not act directly on the closure element, its travel path is greater than that of the closure element. In this way a larger travel path of the actuating element can also be achieved.

It has also been proven as advantageous if a maximum travel path of an actuator of the actuator system and/or a maximum path of the actuating element is limited by a stop device. Here, the term stop device can be very broadly interpreted: a stop device can (as has already been described) be a mechanical element, on which the actuator of the actuating system and/or the actuating element comes into contact in a certain position. However, a stop device can also be realized through appropriate programming or pre-setting of a control of the actuator, i.e. by means of software, for example. Here it is sufficient to use electronic path control in the form of path limiting. Overall, through limiting the path of the actuator of the actuator system and/or of the actuating element it is ensured that the paths of the actuator and the closure element can be adjusted in a defined manner and thus the forces occurring between the actuating element and the closure element can be estimated and defined beforehand.

In addition to the actuator system which moves the actuating element and ultimately the closure element in at least the closure direction, it can be envisaged that the closure element and/or the actuator system is pushed in an opening direction and/or in the closure direction in a spring manner. Such spring-based force exertion on the actuating element and respectivlely on the closure element can, for example when acting in the opening direction, cause the closure element and/or the actuating element to be pushed back into an opening position so that for this movement a separate automatic actuator is not necessary. In this way the dosing system is more simply and effectively designed.

In order to keep a stop device positioned at all times in such a way that it exerts its limiting effect on the path of the actuator system and/or the closure element, it is preferably envisaged that its position can be adjusted and particularly preferably is spring-preloaded. The stop device is not therefore firmly installed, but can be varied in position and then fixed. Spring-loaded fixing has proven to be a simple measure in order to do this.

BRIEF DESCRIPTION OF THE DRAWINGS

The invention will be described again in more detail below with reference to the attached figures. In the various figures the same components have identical reference numbers. In these.

DETAILED DESCRIPTION OF THE PREFERRED EMBODIMENTS

Figure 1:
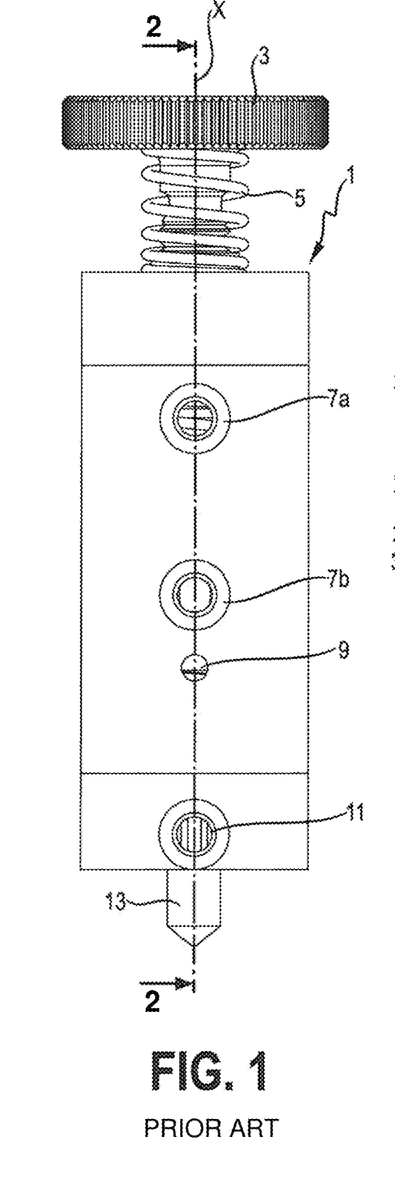
FIG. 1 shows a front view of a dosing system in accordance with the prior art.
Figure 2:
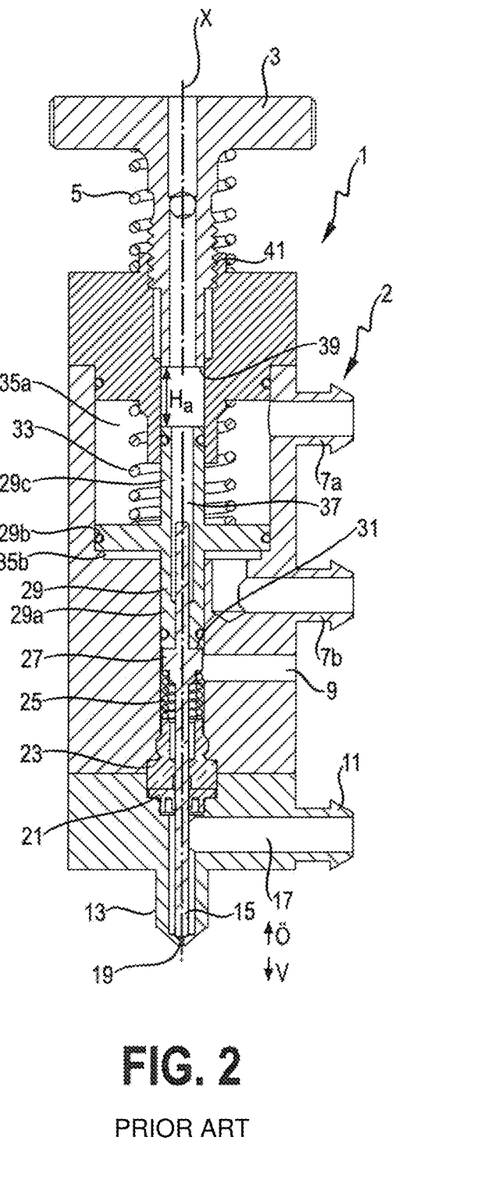
FIG. 2 shows a cross-sectional view of the same dosing system as in FIG. 1 2-2 in a first operational state.

FIGS. 1 and 2 show a dosing system 1 in accordance with the prior art. It comprises an actuator system 2 and a nozzle 13, whereby a closure element 15 in the form of a plunger 15 can be moved by the actuator system 2 in a closure direction V of the nozzle 13, i.e. more particularly in the direction of an outlet opening 19 of the nozzle 13, or in an opening direction Ö away from this outlet opening 19. This closing and opening movement takes place along an effect axis X arranged centrally within the dosing system 1 and defined by the alignment of the plunger 15 within the dosing system 1.

In this form of embodiment the actuator system 2 is in the form of a pneumatic or hydraulic system. This means that an actuator 29 of an actuator system 2 acting as an actuating element 29 can be moved to and fro by pressurised gas or pressurised fluid in a cylinder, in which are located an upper chamber 35a and a lower chamber 35b, which are separated from one another by the actuator 29 designed in the form of a piston 29. The upper chamber 35a and the lower chamber 35b are each supplied by high pressure and low pressure via a first pneumatic inlet 7a and second pneumatic inlet 7b. The first pneumatic inlet 7a leads into the upper chamber 35a and the second pneumatic inlet 7b leads into the lower chamber 35b. If a fluid or a gas is supplied to the first chamber 35a through the first pneumatic inlet 7a with a higher pressure than a pressure that is present over the second inlet 7b in the lower chamber 35b, the piston 29 moves in the direction of the lower chamber 35b. In the case of an opposite pressure ratio the piston 29 moves in the direction of the upper chamber 35a. The movement of the piston 29 downwards in the direction of the outlet opening 19 is additionally supported by an actuator spring 33 which is arranged in the upper chamber 35a so that it pushes the piston 29 downwards.

The piston 29 is designed in one piece and has three sections, namely a lower actuator section 29a, a middle actuator section 29b and an upper actuator section 29c. The middle actuator section 29b is the area of the piston 29 that separates the upper chamber 35a from the lower chamber 35b, while the lower actuator section 29a and the upper actuator section 29c are guided within the housing of the dosing system 1 within cylindrical hollow spaces. The lower actuator section 29a is functionally connected with the plunger 15. This takes place by way of a positive and non-positive connection, which, among other things, consists in the plunger 15 being in contact along a stop location 31, namely along a stop surface 31 directly on the underside of the lower actuator section 29a. For this the plunger 15 has an expanding section 27, the cross-section of which perpendicularly to the closure direction V is larger than the sections of the plunger 15 lying above and below the expanding section 27. The part of the plunger 15 above the expanding area 27 projects into a hollow space 37 within the piston 29 so that the form-fit between the plunger 15 and the piston 29 extends further than just in the area of the stop location 31. The plunger 15 is therefore held with its upper side within the piston 29. On the side of the expanded section 27 facing away from the piston 29 it is also held in an axial alignment along the effect axis X by means of an alignment device 23. Via a circumferential seal 21 it moves into the area of dosing material channel 17 which leads from a supply line 11 in the direction of the outlet opening 19 of the nozzle 13.

The positive or non-positive connection between plunger 15 and the piston 29 along the stop surface 31 is assured by a closure element spring 25 which extends from the alignment device 23 to the expanding section 27 of the plunger 15 and always keeps the latter in connection with the piston 29 in this area. A vent opening 9 serves to equalize high and/or low pressures during movements of the plunger 15.

The dosing system 1 also has a stop device 3 in the form of a stop screw 3 which can, via a thread 41, be screwed in the direction of the interior of the housing of the dosing system 1 hereby limiting the travel path $H_a$ of the piston 29. The stop screw 3 is held in its position by means of a stop spring 5 and can only be moved further into the interior of the housing of the dosing system 1 or moved further out from the interior of the dosing system 1 in a targeted manner. The piston 29 can thereby only be moved as far as the actuator impact location 39 of the stop screw 3 on its end facing the piston 29.

Figure 3:
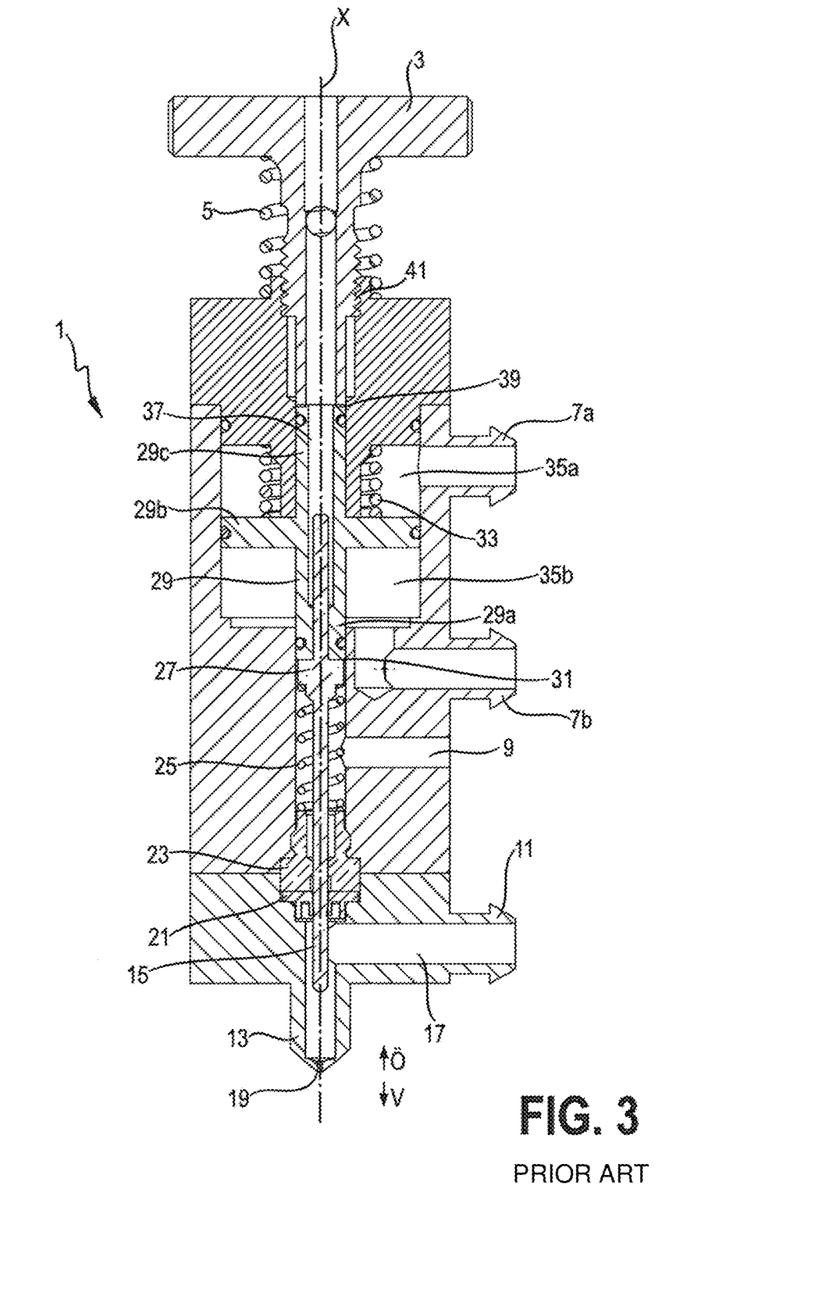
FIG. 3 shows the same cross-sectional view of the same dosing system as in FIG. 2 in a second operational state.

FIG. 3 shows the same dosing device 1 in a second operational state in which the piston 29 is maximally moved up to the actuator impact location 39. The position of the stop screw 3 has not been changed so that the actuator impact location 39 only limits the travel path of the piston 29 to a slight extent. It can be seen that in this upper position of the piston 29 too, the positive or non-positive connection between the piston 29 and the plunger 15 is maintained due to the spring-tensioning of the closure element spring 25 and they are both in permanent connection with each other along the stop location 31.

Figure 4:
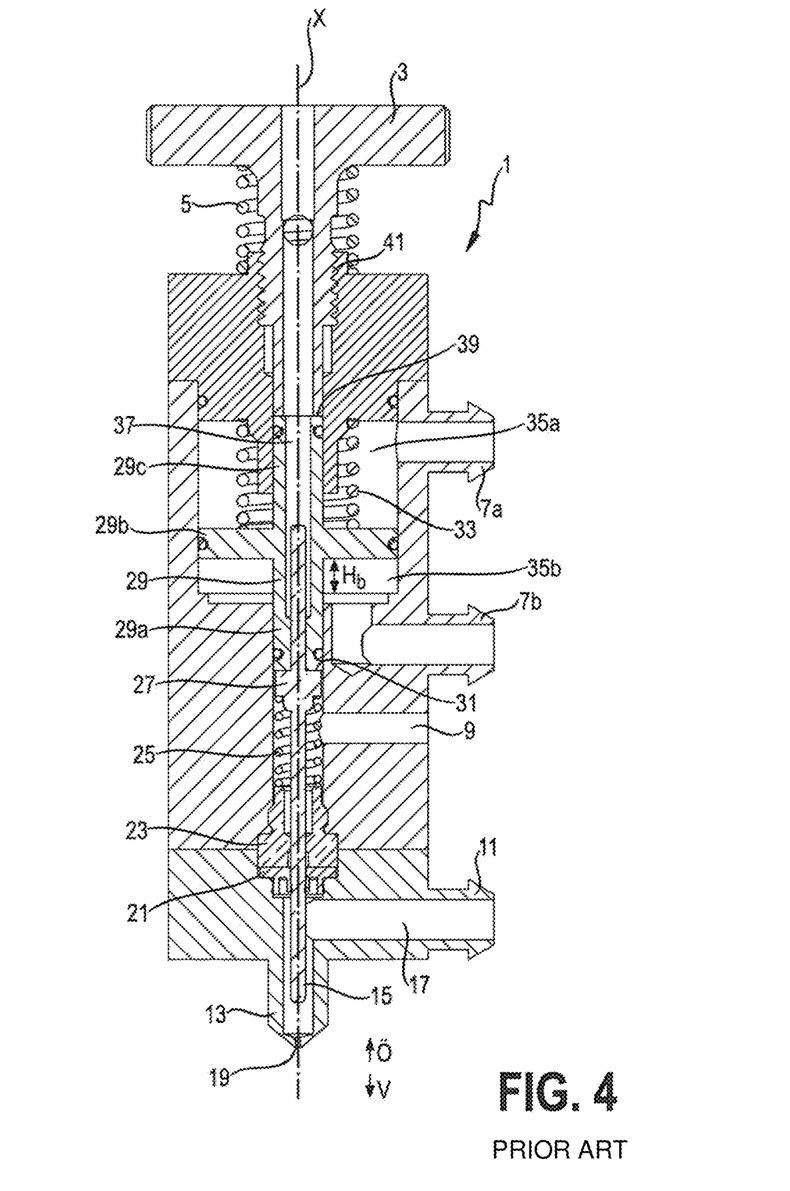
FIG. 4 shows the same cross-sectional view of the same dosing system as in the preceding figures with a change basic setting.

FIG. 4 shows the same dosing system 1 with a changed basic setting. Here the stop screw 3 is screwed further in the inner direction of the housing of the dosing system 1, i.e. in the closure direction V, so that the actuator impact location 39 is positioned further down in the figure. This automatically reduces the travel path $H_b$ of the piston 29. When comparing FIGS. 3 and 4 it can be seen that the position of the plunger 15 in the uppermost possible position of the actuator 29 is thereby changed accordingly. In the basic setting shown in FIG. 4 the lower end of the plunger 15 is closer to the outlet opening 19 than is the case in the basic setting shown in. FIG. 3. This has the effect that the path of the plunger 15 in the closure direction V towards the outlet opening 19 of the nozzle 13 is shorter. However, this also means that the plunger 15 can only be accelerated for a shorter distance and therefore moves in the direction of the outlet opening 19 more slowly. The shortening of the path from a first path $H_a$ (cf. FIG. 3) to a second path $H_b$ (cf. FIG. 4) therefore has negative effects on the reaction rate of the plunger.

Figure 5:
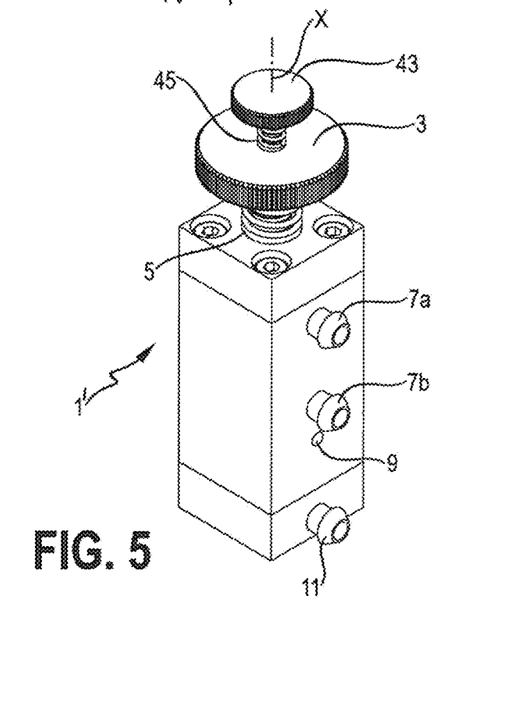
FIG. 5 shows a perspective view of a first example of embodiment of dosing system in accordance with the invention.
Figure 6:
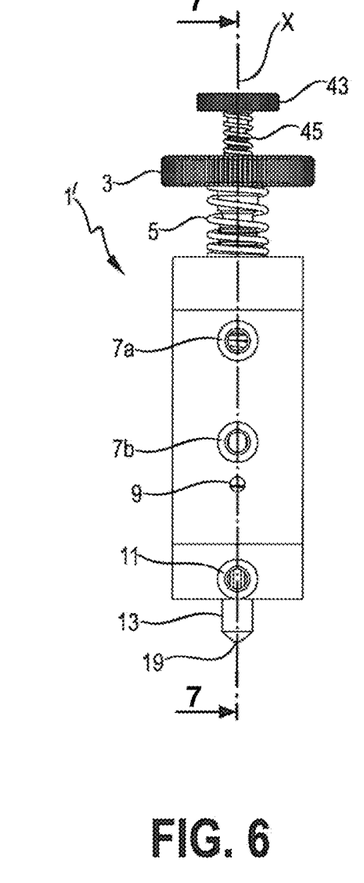
FIG. 6 shows a front view of the same dosing system in accordance with the invention as in FIG. 5.
Figure 7:
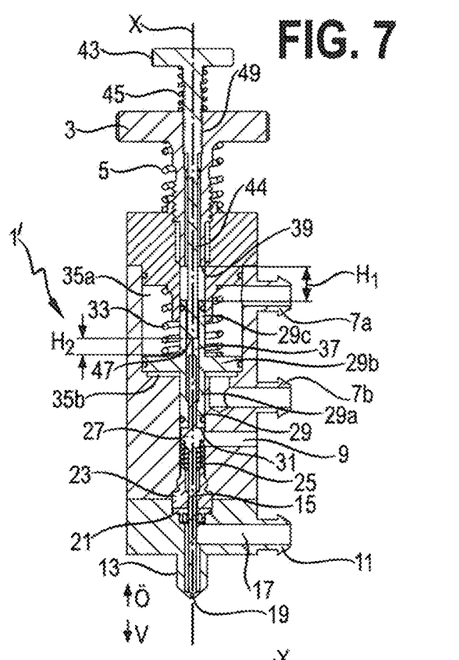
FIG. 7 shows a cross-sectional view of the same dosing system as in FIGS. 5 and 6 along a line 7-7 in FIG. 6, whereby the dosing system is shown in a first operational state.
Figure 8:
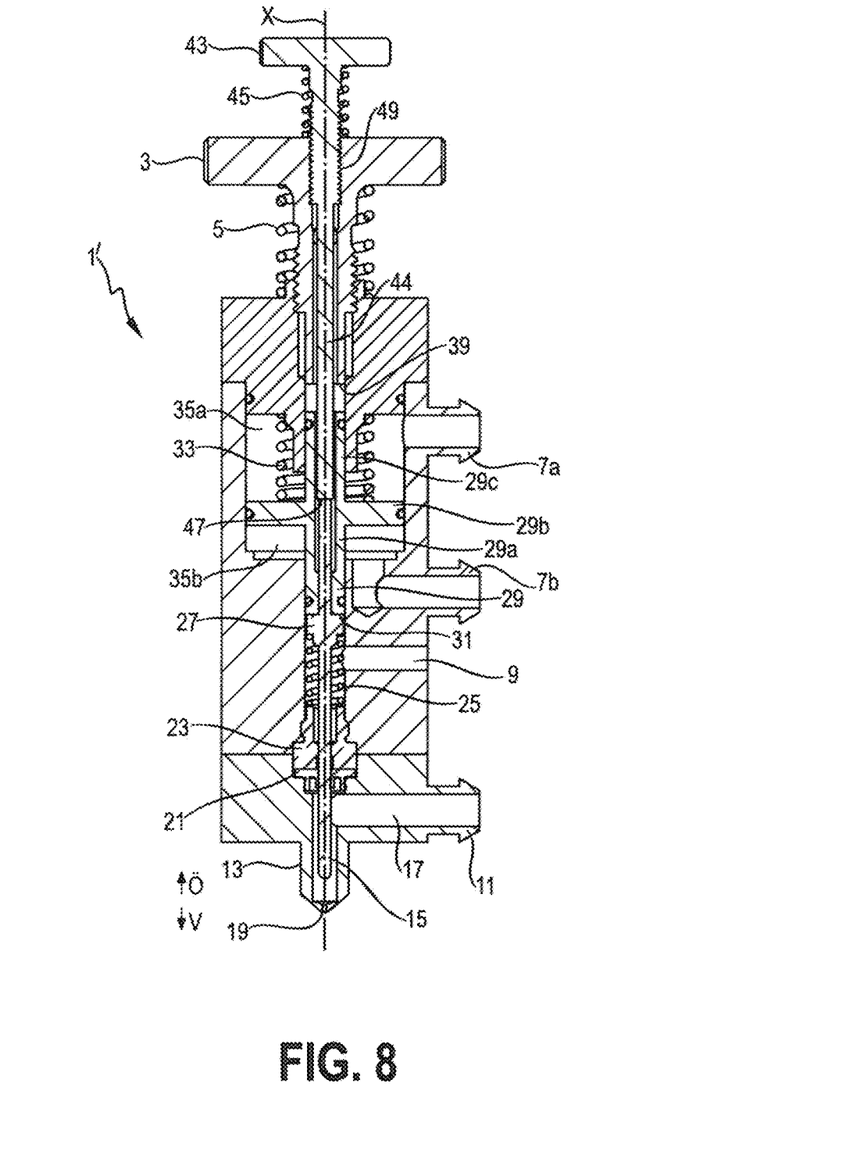
FIG. 8 shows the same cross-sectional view of the same dosing system as in FIG. 7 in a second operational state.

FIGS. 5, 6 and 7 show a first form of an embodiment of a dosing system 1' in accordance with the invention. In addition to the already known elements mentioned in the previous figures, it has a stop device 43 which is inserted in the already mentioned stop screw 3. The stop device 43 is in turn held within the stop screw 3 by means of a thread 49, so that it can be moved in the direction of the interior of the housing, i.e. in the closure direction V or can be screwed out in the opposite direction. The stop device 43 is also held in a spring-preloaded manner by means of a stop spring 45. In a lower section the stop device 43 projects via the actuator impact location 39 and is positioned with a hollow space of the piston 29 in the upper actuator section 29c. At its lower side facing the plunger 15, the stop device has a plunger impact location 47. The path of the plunger 15 from the outlet opening 19 of the nozzle 13 to the plunger impact location 47 is therefore a limited path $H_2$, which is smaller compared with the limited path $H_1$ of the piston 29. The effect of this reduced maximum path $H_2$ is clarified by way of FIGS. 8 and 9:

FIG. 8 shows the same dosing device 1', whereby the plunger 15 has now been moved to a position defined by the plunger impact location 47, which has taken place on the basis of the spring force of the closure element spring 25. It can also be seen that the piston 29 can still travel a further distance to its actuator impact location 39. In this position, along the stop location 31, along which they were previously positively or non-positively connected to each other, the plunger 15 and the piston 29 are separated from one another, i.e. decoupled. This effect can be seen in particular in FIG. 9 where the piston 29 has now also reached the actuator impact location 39 and is already separated from the plunger 15 at the stop location 31.

Figure 9:
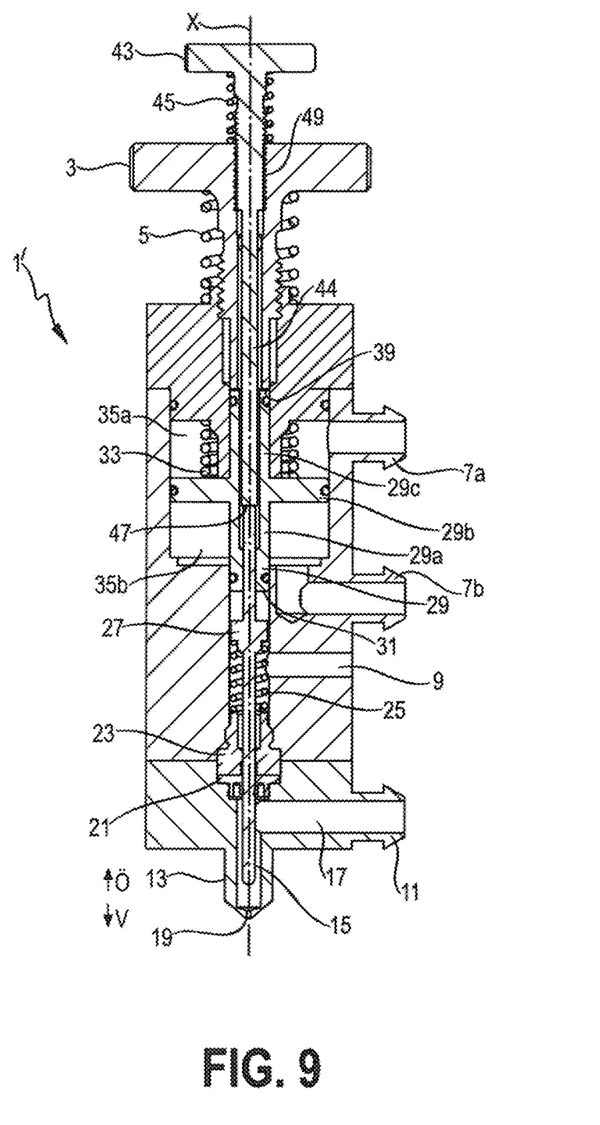
FIG. 9 shows the same cross-sectional view of the same dosing system as in FIGS. 7 and 8 in a third operational state.

If the upwards movement in the opening direction shown by way of FIGS. 7, 8 and 9 is now performed in the opposite direction, namely in the closure direction V, the piston 29 is initially moved downwards in the closure direction V, then impacts on the plunger 15 at the stop location 31 in the position shown in FIG. 8 and thereby exerts an impulse I on the plunger 15. This then moves on more quickly than the piston to the position shown in FIG. 7. The piston 29 therefore completes a first partial movement alone, impacts the plunger 15 at the stop location 31 and then in a second partial movement moves separately from the plunger 15 in the direction of the outlet opening 19. Once the plunger has reached the outlet opening 19 the piston 29 and the plunger briefly come into contact again at the stop location 31. This now produces the effect that gives the invention a new quality: on its path during the first partial movement from its uppermost position to the position shown in FIG. 8, the piston 29 alone develops a velocity so that it can exert an impulse I on the plunger 15 when impacting on the stop location 31. This prior acceleration of the piston 29, without the plunger 15, results in the plunger 15 now being able to achieve a higher velocity than the piston 29. Through this the closure movement of the plunger 15 is faster—it can reach the outlet opening 19 in its end position of the plunger 15 more quickly.

Figure 10:
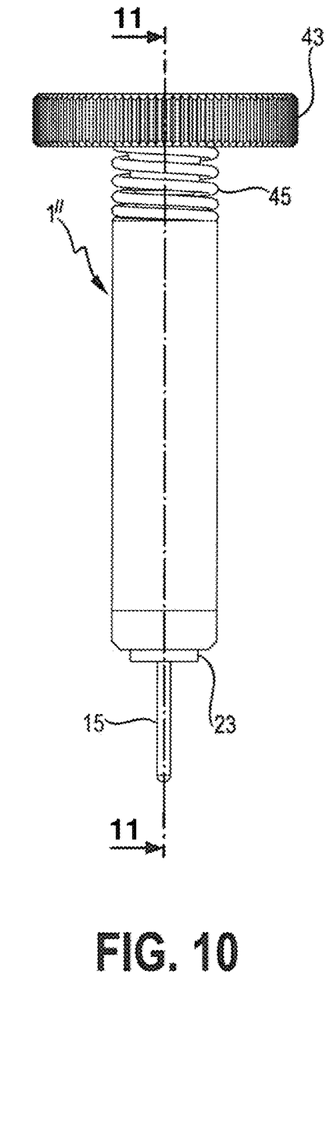
FIG. 10 shows a front view of a second form of embodiment of a dosing system in accordance with the invention.
Figure 11:
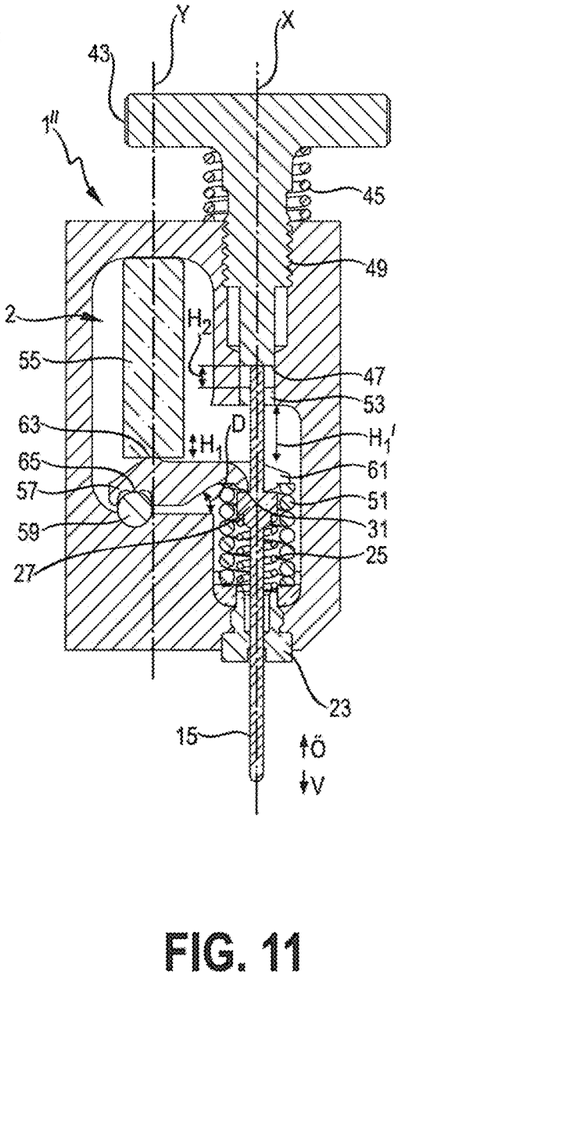
FIG. 11 shows a cross-sectional view of the dosing system as in FIG. 10 along a line—11-11.

FIGS. 10 and 11 show a second form of an embodiment of the dosing system 1" in accordance with the invention. Here the actuator system 2 is not a pneumatic or hydraulic actuator system 2, but it has a piezoelectric actuator 55, the movements of which are transmitted via a lever 57 to a plunger 15. In this example of an embodiment the nozzle area is not shown, but can be designed in the same way as the example of an embodiment shown in FIGS. 1 to 9. The lever 57 is borne at three points: at a stop location 31 it is temporarily connected to the expanding section 27 of the plunger 15, which is designed in the same way as in the forms shown in the previous figures. Here an end section 61 of the lever encapsulates the upper part of the plunger 15. This end section is therefore designed to be V-shaped or fork-shaped in its cross-section perpendicular to the closure direction. On the top, in the direction of the piezoelectric actuator 55, the lever 57 has a small projection which ends in a first support area 63 where it is connected to the piezoelectric actuator 55 by means of a linear support area. The lever 57 is also borne on its lower side facing away from the piezoelectric actuator 55 via a second linear support area in a second support area 65 on a cylindrical pin 59. In order to reduce friction between the lever 57 and the cylindrical pin 59 the lever 57 has two recesses in the second support area 65. In the opening direction Ö the plunger 15 is pressed via a closure element spring 25 and the lever 57 via an actuator spring 51.

If the piezoelectric actuator 55 is stimulated to move, this movement is transformed via the first support area 63 into a rotary movement. With this the plunger 15 is moved along the effect axis X in the closure direction with the aid of the contact at the stop location 31. The path of the piezoelectric actuator 55 is not necessarily the same as path $H_1'$, travelled by the lever 57 as actuating element 57 along effect axis X. Rather, through appropriate transmission, a larger path $H_1'$ can be travelled along axis X. There is therefore a first path $H_1$ along actuator axis Y of the piezoelectric actuator 55 and a second path $H_1'$ along the effect axis X of the plunger 15.

On its upper side the plunger 15 is in turn stopped by a stop device 43 at a plunger impact location 47. It therefore has a path $H_2$ that is smaller than the path $H_1'$ of the lever 57 along the effect axis X. Also as soon as the position shown here is reached during a movement in the opening direction, the stop lever 57 moves away from the stop location 31 and is separated from the plunger 15; the lever 57 travels on upwards by itself. In the other direction the lever 57 initially moves along in the direction of the plunger 15, comes into contact with the latter at the stop location 31 and moves it with an impulse further in the direction of an outlet opening of a nozzle. This principle essentially corresponds to the sequence that has already been explained by way of FIGS. 5 to 9.

Whereas the example of embodiment shown by way of FIGS. 5 to 9 showed a pneumatic or hydraulic system that was completely aligned along an effect axis X, FIGS. 10 and 11 now have now shown a piezoelectric actuator system that has an actuator axis Y that differs from effect axis X. Hydraulic or pneumatic systems can also of course be fitted with force transmission elements, i.e. operating elements such as levers or catches, and, in turn, a piezoelectric actuator system can be produced in an arrangement purely aligned on the effect axis.

Figures 12, 13:
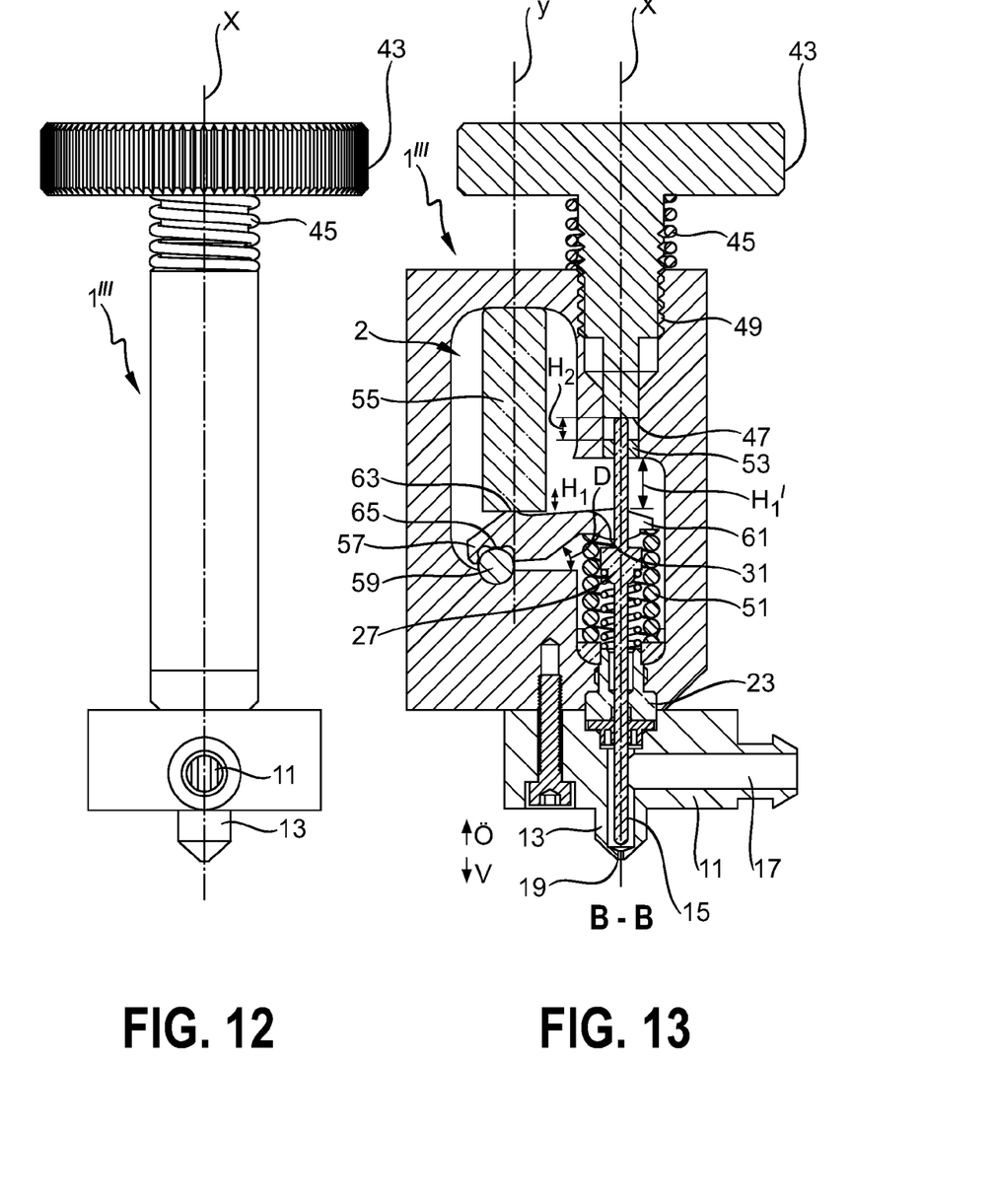
FIG. 12 shows a front view of a third form of embodiment of a dosing system in accordance with the invention.
FIG. 13 shows a cross-sectional view of the dosing system as in FIG. 12 along a line X with the dosing system in position B-B.
Figure 14:
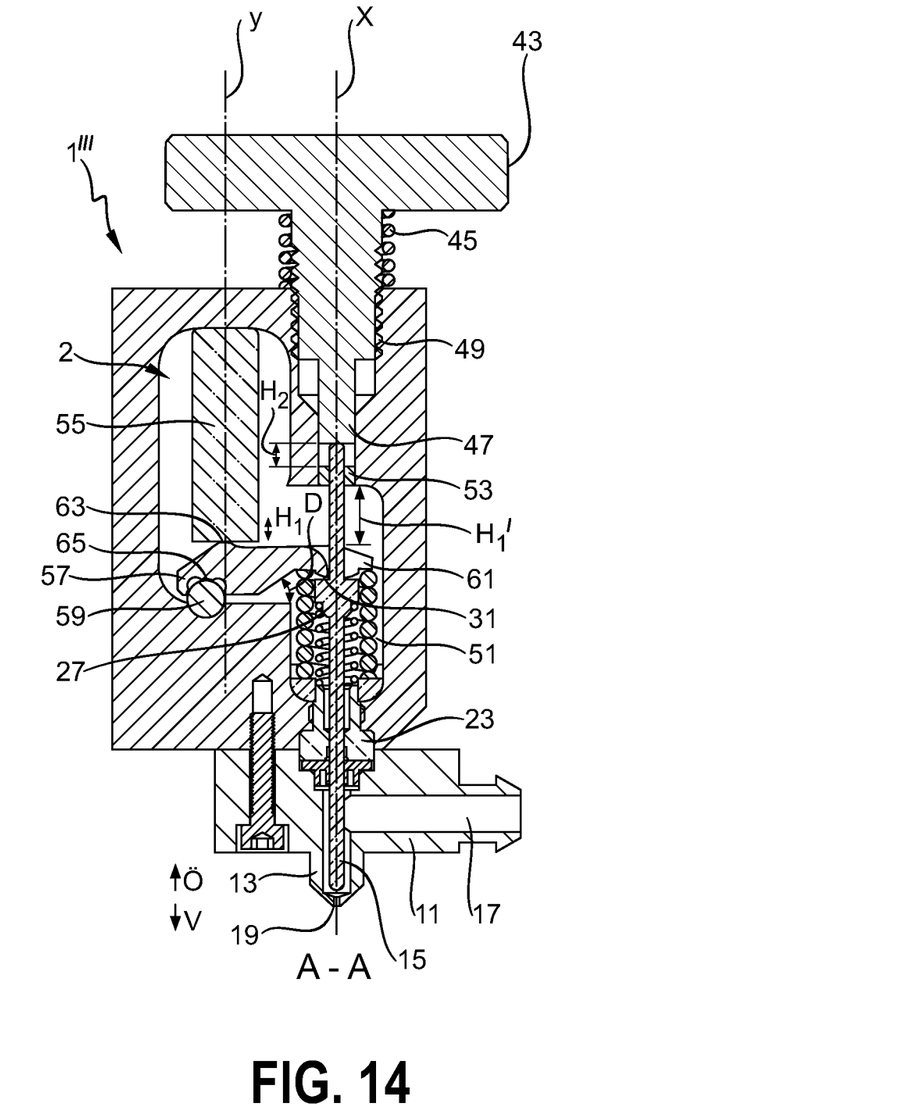
FIG. 14 shows a cross-sectional view of the dosing system as in FIG. 12 along a line X with the dosing system in position A-A.
Figure 15:
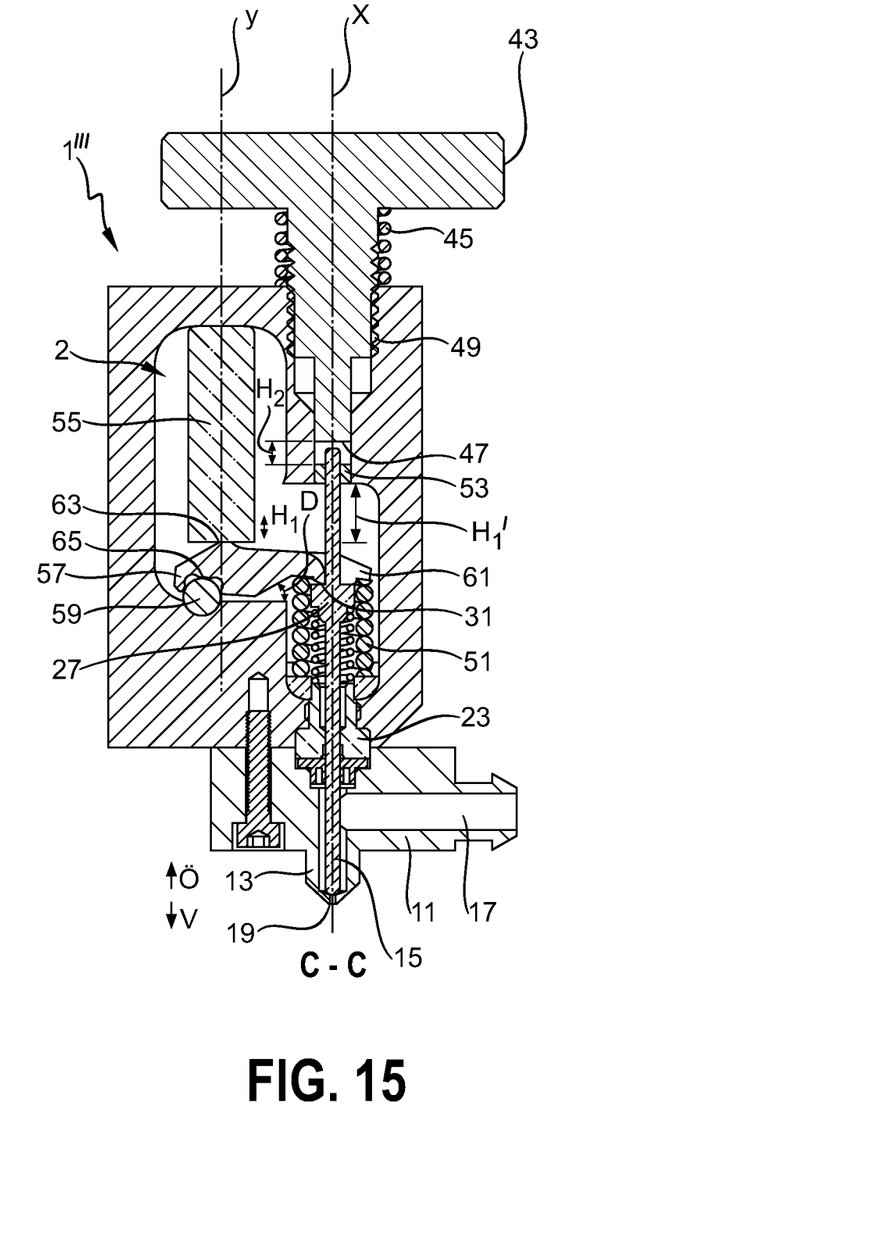
FIG. 15 shows a cross-sectional view of the dosing system as in FIG. 12 along a line X with the dosing system in position C-C.

FIG. 12 is similar to original FIG. 10; however, the nozzle is shown in addition, similar to the nozzle 11 in the other figures (e.g., FIG. 6). FIG. 14 shows the lever and the plunger in the same position (A-A) as in FIG. 11 of the application (but in contrast to FIG. 11, here, again the nozzle is shown). The two additional drawings, FIGS. 13 and 15, show the same dosing system as in FIG. 14 but in different positions (B-B and C-C, respectively) of the lever and the plunger. Specifically, FIG. 13 shows the lever 57 separated from the plunger 15. FIG. 14 shows the lever 57 striking the plunger 15 at the stop location 31. FIG. 15 shows the situation when the lever 57 pushes the plunger 15 against the seat of the valve of the nozzle.

Finally it is again pointed out that the components of the dosing system and nozzle and of the actuator system described in detail above are purely examples of an embodiment, which can be modified by a person skilled in art in the most varied of ways without departing from the scope of the invention. Furthermore the use of the indefinite article "a" or "an" does not preclude the relevant feature being able to be present as a plurality. "Units" can also consist of one or more, including spatially distributed, components.

LIST OF REFERENCES 1, 1', 1" Dosing system
2 Actuator system
3 Stop device—stop screw
5 Stop spring
7a, 7b Pneumatic inlets
9 Vent opening
11 Supply line
13 Nozzle
15 Closure element—plunger
17 Dosing material channel
19 Outlet opening
21 Seal
23 Alignment device
25 Closure element spring
27 Expanding section
29 Actuator—piston
29a Lower actuator section
29b Middle actuator section
29c Upper actuator section
31 Stop location—stop surface
33 Actuator spring
35a Upper chamber
35b Lower chamber
37 Hollow space
39 Actuator impact location
41 Thread
43 Stop device
45 Stop spring
47 Plunger impact location
49 Thread
51 Actuator spring
55 Piezoelectric actuator
57 Lever
59 Cylindrical pin
61 End section
63 First support area
65 Second support area
D Rotary movement
$H_a$, $H_b$, $H_1$, $H_1'$, $H_2$ Path I Impulse
Ö Opening direction
V Closure direction
X Effect axis
Y Actuator axis

The invention claimed is:

1. A dosing system for a liquid or viscous dosing material, the dosing system comprising
    a nozzle with an outlet opening,
    a closure element, and
    an actuator system having a piezoelectric actuator and at least one actuating element comprising a lever which temporarily connects the piezoelectric actuator with the closure element,
    whereby the dosing system is designed so that during a movement in a closure direction the actuating element is initially moved in a first partial movement in such a way that the actuating element is separated from the closure element at an intended stop location, and then strikes the closure element at the stop location and exerts an impulse on the closure element.

2. The dosing system according to claim 1, wherein the actuator system and the closure element are both designed, arranged and limited in such a way that in operation the actuating element and the closure element travel a different maximum path along an axis of the closure direction.

3. The dosing system according to claim 2, wherein the maximum path of the closure element is smaller than the maximum path of the actuating element.

4. The dosing system according to claim 2, wherein the maximum path of the closure element along the axis in the closure direction is limited by a limit stop device.

5. The dosing system according to claim 4, wherein a position of the stop device is adjustable.

6. The dosing system according to claim 5, wherein the stop device is an automatically motorized, adjustable stop device.

7. The dosing system according to claim 1, wherein a maximum operating path of an actuator of the actuator system differs from a maximum path of the closure element.

8. The dosing system according to claim 1, wherein at least one of a maximum operating path of an actuator and a maximum path of the actuating element of the actuator system is limited by a stop device.

9. The dosing system according to claim 1, wherein at least one of the closure element and the actuator system is pressed, spring-based, in at least one of an opening direction and in the closure direction.

10. The dosing system according to claim 1, further comprising at least one, spring-preloaded, stop device the position of which is adjustable.

11. A method of dosing a liquid or viscous dosing material with the aid of a dosing system, including
    a nozzle with an outlet opening, a closure element and an actuator system, that has a piezoelectric actuator and at least one actuating element comprising a lever which temporarily connects the piezoelectric actuator with the closure element,
    the method comprising the steps of
    initially moving the actuating element in a first partial movement in such a way that the actuating element is separated from the closure element at an intended stop location, and then strikes the closure element at the stop location and exerts an impulse on the closure element.

* * * * *